United States Patent
Konishi

(10) Patent No.: US 12,249,695 B2
(45) Date of Patent: Mar. 11, 2025

(54) BATTERY CONTROL DEVICE, BATTERY CONTROL METHOD, OPERATION MANAGEMENT SYSTEM, AND OPERATION MANAGEMENT METHOD

(71) Applicant: TOYOTA JIDOSHA KABUSHIKI KAISHA, Toyota (JP)

(72) Inventor: Toshiyuki Konishi, Anjo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 604 days.

(21) Appl. No.: 17/551,912

(22) Filed: Dec. 15, 2021

(65) Prior Publication Data
US 2022/0247001 A1 Aug. 4, 2022

(30) Foreign Application Priority Data
Feb. 1, 2021 (JP) ................................. 2021-014185

(51) Int. Cl.
*G01R 31/382* (2019.01)
*B60L 58/12* (2019.01)
(Continued)

(52) U.S. Cl.
CPC ........... *H01M 10/443* (2013.01); *B60L 58/12* (2019.02); *B60W 10/26* (2013.01); *G01R 31/382* (2019.01);
(Continued)

(58) Field of Classification Search
CPC .............. H02J 7/00032; H02J 7/0048; H02J 13/00002; H02J 7/005; H02J 7/0047;
(Continued)

(56) References Cited

U.S. PATENT DOCUMENTS

2010/0324765 A1* 12/2010 Iida ..................... B60L 15/2045
701/22
2013/0103240 A1* 4/2013 Sato .................. H02J 7/007192
701/22
(Continued)

FOREIGN PATENT DOCUMENTS

JP 2006-081300 A 3/2006
JP 2013-112326 A 6/2013
(Continued)

*Primary Examiner* — Binh C Tat
(74) *Attorney, Agent, or Firm* — Oliff PLC

(57) ABSTRACT

A battery control device includes: a charging/discharging control unit; an outside air temperature acquiring unit; and a state-of-charge upper limit setting unit setting a state-of-charge upper limit which is an upper limit of the management range of the state of charge when the acquired outside air temperature is lower than a predetermined air temperature to a low-temperature state-of-charge upper limit which is lower than the state-of-charge upper limit when the outside air temperature is higher than the predetermined air temperature. The battery control device further includes a state-of-charge lower limit setting unit setting a state-of-charge lower limit when the acquired outside air temperature is lower than the predetermined air temperature to a low-temperature state-of-charge lower limit which is lower than the state-of-charge lower limit when the outside air temperature is higher than the predetermined air temperature.

11 Claims, 5 Drawing Sheets

(51) Int. Cl.
*B60W 10/26* (2006.01)
*H01M 10/44* (2006.01)
*H01M 10/48* (2006.01)

(52) U.S. Cl.
CPC ..... *H01M 10/486* (2013.01); *B60L 2240/545* (2013.01)

(58) Field of Classification Search
CPC ............... H02J 13/00022; H02J 7/0025; H02J 7/00309; H02J 2310/48; H02J 7/0013; H02J 3/322; H02J 7/007192; H02J 7/342; H02J 2310/42; H02J 2310/54; H02J 2310/64; H02J 3/008; H02J 3/144; H02J 50/12; H02J 7/00034; H02J 7/0014; H02J 7/0042; H02J 7/007194; H02J 7/02; H02J 7/04; H02J 1/109; H02J 2300/30; H02J 3/32; H02J 7/00; H02J 7/0029; H02J 7/007; H02J 7/007188; H02J 7/1423; H02J 7/1438; H02J 7/1446; H02J 7/34; H01M 10/625; H01M 10/613; H01M 2220/20; H01M 10/488; H01M 2010/4278; H01M 2010/4271; H01M 10/482; H01M 10/4257; H01M 16/006; H01M 8/04597; H01M 8/04656; H01M 8/04686; H01M 10/486; H01M 10/63; H01M 2250/20; H01M 10/42; H01M 8/04626; H01M 8/04567; G01R 31/367; G01R 31/382; G01R 31/392; G01R 31/3648; G01R 31/3647; G01R 31/371; G01R 31/374; G01R 31/379; G01R 31/3835; G01R 31/388; G01R 31/396; G01R 31/3646; G01R 31/389
USPC .................................................. 320/132–136
See application file for complete search history.

(56) References Cited

U.S. PATENT DOCUMENTS

2013/0144515 A1    6/2013   Okamoto et al.
2014/0176085 A1*   6/2014   Maruno .................. B60R 16/00
                                                                  320/162

FOREIGN PATENT DOCUMENTS

| JP | 2014-504977 A | 2/2014 |
| JP | 2015-011576 A | 1/2015 |
| WO | 2012/076928 A1 | 6/2012 |
| WO | 2014/207980 A1 | 12/2014 |

* cited by examiner

BATTERY CONTROL DEVICE, BATTERY CONTROL METHOD, OPERATION MANAGEMENT SYSTEM, AND OPERATION MANAGEMENT METHOD

CROSS-REFERENCE TO RELATED APPLICATION

This application claims priority to Japanese Patent Application No. 2021-014185 filed on Feb. 1, 2021, incorporated herein by reference in its entirety.

BACKGROUND

1. Technical Field

The present disclosure relates to battery control and operation management of a motor-driven vehicle.

2. Description of Related Art

A motor-driven vehicle travels by storing electric power in a battery mounted therein and driving a motor with the electric power. Characteristics of a battery change according to its temperature. A technique of changing charging/discharging control with a change in characteristics due to a change in temperature of a battery is known. Japanese Unexamined Patent Application Publication No. 2006-81300 (JP 2006-81300 A) discloses a technique of controlling a battery of a hybrid vehicle by changing an upper limit and a lower limit of an input/output voltage of the battery according to the temperature of the battery.

SUMMARY

When the temperature of a battery decreases, a charging period of time thereof tends to increase. Particularly, in commercial vehicles such as regular-route buses and taxis, a long charging period of time causes a decrease in operation rate of vehicles.

The present disclosure decreases a charging time at a low temperature.

According to an aspect of the present disclosure, there is provided a battery control device that controls charging/discharging of a battery for power of a commercial motor-driven vehicle, the battery control device including: a charging/discharging control unit configured to control charging/discharging such that a state of charge of the battery is in a predetermined management range; an outside air temperature acquiring unit configured to acquire an outside air temperature; and a state-of-charge upper limit setting unit configured to set a state-of-charge upper limit which is an upper limit of the management range when the acquired outside air temperature is lower than a predetermined air temperature to a low-temperature state-of-charge upper limit which is lower than the state-of-charge upper limit when the outside air temperature is higher than the predetermined air temperature.

When charging is performed in a state in which the state of charge is low, an amount of heat emitted from the battery is greater than that when the state of charge is high and thus the temperature of the battery increases. By setting the state-of-charge upper limit to be lower when the outside air temperature is low and the battery temperature is likely to decrease, it is possible to increase an opportunity for charging at a low state of charge and to increase the battery temperature. In a state in which the battery temperature is high, charging efficiency is better and thus charging is completed in a shorter time in comparison with a state in which the battery temperature is low.

The battery control device may further include a state-of-charge lower limit setting unit configured to set a state-of-charge lower limit which is a lower limit of the management range when the outside air temperature is lower than the predetermined air temperature to a low-temperature state-of-charge lower limit which is lower than the state-of-charge lower limit when the outside air temperature is higher than the predetermined air temperature. Accordingly, it is possible to perform charging at a lower state of charge and thus to increase the battery temperature.

The state-of-charge lower limit setting unit may be configured to set the low-temperature state-of-charge lower limit such that a width of the management range of a state of charge when the outside air temperature is lower than the predetermined air temperature is the same as the width when the outside air temperature is higher than the predetermined air temperature. Accordingly, it is possible to secure a state of charge equivalent to that when the outside air temperature is high.

The battery control device may further include a next travel distance acquiring unit configured to acquire a travel distance to next charging of the commercial motor-driven vehicle to be charged, and the state-of-charge upper limit setting unit may be configured to change the low-temperature state-of-charge upper limit based on the travel distance to the next charging. Accordingly, it is possible to secure a state of charge based on the next travel distance.

The battery control device may further include an operation start time acquiring unit configured to acquire a next operation start time of the commercial motor-driven vehicle to be charged, and the charging/discharging control unit may be configured to control charging/discharging such that charging ends immediately before the operation start time when the state-of-charge upper limit is set to the low-temperature state-of-charge upper limit. Accordingly, it is possible to curb a decrease of the battery temperature from charging to start of the operation and to maintain the battery at a high temperature.

The battery control device may further include an outside air temperature forecast acquiring unit configured to acquire a forecast of an outside air temperature, and the state-of-charge upper limit setting unit may be configured to set the state-of-charge upper limit to the low-temperature state-of-charge upper limit when the forecasted outside air temperature is lower than the predetermined temperature. Accordingly, it is possible to increase the battery temperature in advance before the outside air temperature decreases.

According to another aspect of the present disclosure, there is provided an operation management system that manages an operation of a commercial motor-driven vehicle, the operation management system including: a battery control device that controls charging/discharging of a battery for power of a commercial motor-driven vehicle; and a route selecting unit configured to select an operation route of the commercial motor-driven vehicle. The battery control device includes a charging/discharging control unit configured to control charging/discharging such that a state of charge of the battery is in a predetermined management range, an outside air temperature acquiring unit configured to acquire an outside air temperature, and a state-of-charge upper limit setting unit configured to set a state-of-charge upper limit which is an upper limit of the management range of a state of charge when the acquired outside air temperature is lower than a predetermined air temperature to a low-temperature state-of-charge upper limit which is lower than the state-of-charge upper limit when the outside air temperature is higher than the predetermined air temperature. The route selecting unit is configured to select an operation route based on a travel distance corresponding to the low-temperature state-of-charge upper limit as the operation route of the commercial motor-driven vehicle in which the state-of-charge upper limit is set to the low-temperature state-of-charge upper limit. Accordingly, it is possible to select an operation route with a travel distance based on a vehicle in which the state-of-charge upper limit has been curbed and the state of charge has decreased.

According to another aspect of the present disclosure, there is provided an operation management system that manages operations of a plurality of commercial motor-driven vehicles, the operation management system including: one of the aforementioned battery control devices that controls charging/discharging of a battery for power of a commercial motor-driven vehicle; a vehicle allocating unit configured to determine allocation of the commercial motor-driven vehicles to services of an operation plan; a battery temperature acquiring unit configured to acquire a battery temperature which is a temperature of the battery; and a passenger number prediction information acquiring unit configured to acquire prediction information of the number of passengers for each service. The vehicle allocating unit is configured to allocate a commercial motor-driven vehicle in which the acquired battery temperature is low out of the plurality of commercial motor-driven vehicles to a service in which the number of passengers based on the acquired prediction information of the number of passengers is large. By allocating the commercial motor-driven vehicle with a low battery temperature to a service in which the number of passengers is large, it is possible to advance a decrease of the state of charge and to promote charging in a low state-of-charge state.

According to another aspect of the present disclosure, there is provided an operation management system that manages operations of a plurality of commercial motor-driven vehicles, the operation management system including: one of the aforementioned battery control devices that control charging/discharging of a battery for power of a commercial motor-driven vehicle; a vehicle allocating unit configured to determine allocation of the commercial motor-driven vehicles to services of an operation plan; a battery temperature acquiring unit configured to acquire a battery temperature which is a temperature of the battery; and a congestion prediction information acquiring unit configured to acquire congestion prediction information for each service. The vehicle allocating unit is configured to allocate a commercial motor-driven vehicle in which the acquired battery temperature is low out of the plurality of commercial motor-driven vehicles to a service in which congestion based on the acquired congestion prediction information is predicted. By allocating the commercial motor-driven vehicle with a low battery temperature to a service in which congestion is predicted, it is possible to advance a decrease of the state of charge and to promote charging in a low state-of-charge state.

According to another aspect of the present disclosure, there is provided an operation management system that manages operations of a plurality of commercial motor-driven vehicles, the operation management system including: one of the aforementioned battery control devices that controls charging/discharging of a battery for power of a commercial motor-driven vehicle; a vehicle allocating unit configured to determine allocation of the commercial motor-driven vehicles to services of an operation plan; a battery temperature acquiring unit configured to acquire a battery temperature which is a temperature of the battery; and a travel distance acquiring unit configured to acquire a travel distance for each service. The vehicle allocating unit is configured to allocate a commercial motor-driven vehicle in which the acquired battery temperature is low out of the plurality of commercial motor-driven vehicles to a service in which a travel distance based on the acquired travel distance is long. By allocating the commercial motor-driven vehicle with a low battery temperature to a service in which the travel distance is long, it is possible to advance a decrease of the state of charge and to promote charging in a low state-of-charge state.

According to another aspect of the present disclosure, there is provided a battery control method of controlling charging/discharging of a battery for power of a commercial motor-driven vehicle, the battery control method including: controlling charging/discharging such that a state of charge of the battery is in a predetermined management range; and setting a state-of-charge upper limit which is an upper limit of the management range of a state of charge when an outside air temperature is lower than a predetermined air temperature to a low-temperature state-of-charge upper limit which is lower than the state-of-charge upper limit when the outside air temperature is higher than the predetermined air temperature. The battery control method may further include setting a state-of-charge lower limit which is a lower limit of the management range of a state of charge in addition to the state-of-charge upper limit when the outside air temperature is lower than the predetermined air temperature to a low-temperature state-of-charge lower limit which is lower than the state-of-charge lower limit when the outside air temperature is higher than the predetermined air temperature. At this time, the state-of-charge lower limit may be set such that the width of the management range of the state of charge does not change.

According to another aspect of the present disclosure, there is provided a battery control method of controlling charging/discharging of a battery for power of a commercial motor-driven vehicle, the battery control method including: controlling charging/discharging such that a state of charge of the battery is in a predetermined management range; and setting a state-of-charge upper limit which is an upper limit of the management range of the state of charge in a predetermined winter period to a winter state-of-charge upper limit which is lower than the state-of-charge upper limit in a period other than the predetermined winter period. The battery control method may further include setting a state-of-charge lower limit which is a lower limit of the management range of the state of charge in addition to the state-of-charge upper limit in the predetermined winter period to a winter state-of-charge lower limit which is lower than the state-of-charge lower limit in a period other than the predetermined winter period. At this time, the state-of-charge lower limit may be set such that the width of the management range of the state of charge does not change.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

Figure 1:
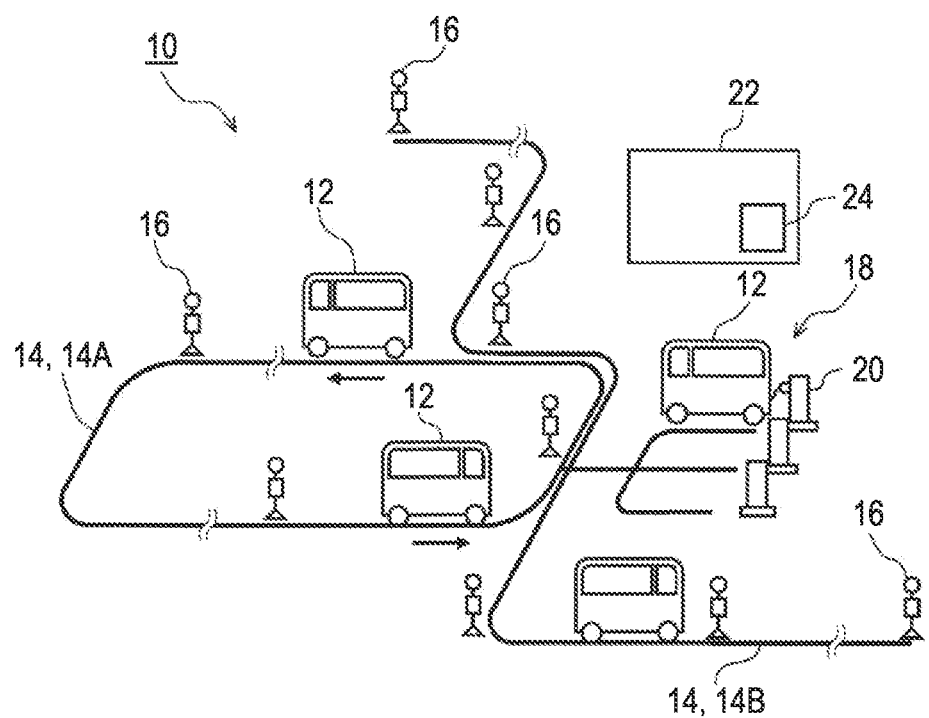
FIG. 1 is a diagram schematically illustrating a configuration of an operation system according to an embodiment.

Hereinafter, an embodiment of the present disclosure will be described with reference to the accompanying drawings. FIG. 1 is a diagram schematically illustrating an operation system 10 of regular-route buses. A vehicle 12 which is a regular-route bus travels along a fixed route (regular route) 14 according to an operation plan, and a bus stop 16 is provided at a plurality of positions along the regular route 14. The operation system 10 includes two routes 14, that is, a circuit route 14A and a shuttle route 14B. The route may include only one of a circuit route and a shuttle route or may have more routes. The vehicle 12 circulates in one direction along the circuit route 14A or shuttles along the shuttle route 14B while stopping and starting at all bus stops 16 or at necessary bus stops 16. The vehicle 12 is a motor-driven vehicle that travels with electric power in a battery mounted therein. A charging station 18 is provided in the vicinity of the route 14 and the vehicle 12 charges the battery in the charging station 18. A charging stand 20 is provided in the charging station 18, and charging is performed by connecting a plug provided in the vehicle 12 to a plug socket of the charging stand 20. The operation of the vehicle 12 is managed by an operation management center 22. The operation management center 22 allocates vehicles 12 to services which are determined in operation plans based on predetermined information such as a length of each route 14 or the operation plans, operation conditions such as a state of charge of the battery of each vehicle 12 or the number of passengers which vary from time to time, and outside conditions such as an outside air temperature or congestion information. An operation management device 24 is provided in the operation management center 22, and the operation management device 24 manages all or some of the operations of the vehicles 12. A part of operation management may be performed by an operator in the operation management center 22. An operation plan may include information on services each defined as an operation in which one vehicle departs from the charging station 18 and returns to the charging station 18 (such as a travel distance of the corresponding service and departure/arrival times at each bus stop) and allocation of the vehicles 12 to the services.

Figure 2:
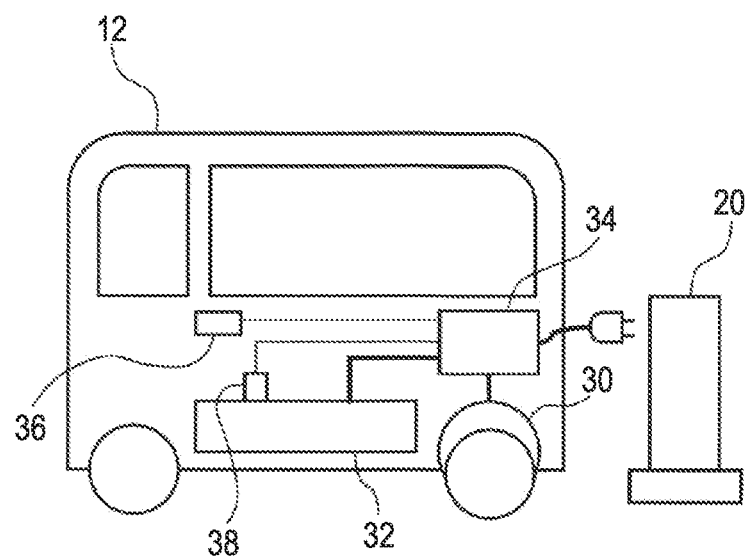
FIG. 2 is a diagram schematically illustrating a configuration of a vehicle according to the embodiment.

FIG. 2 is a diagram schematically illustrating a configuration of a vehicle 12. As described above, the vehicle 12 is a motor-driven vehicle that is driven by an electric motor 30. In the following description, the electric motor 30 is simply referred to as a motor 30. The vehicle 12 includes a battery 32 that stores electric power supplied to the motor 30 and a battery control device 34 that controls the battery 32. The battery control device 34 controls electric power which is supplied from the battery 32 to the motor 30 based on required power and performs control for charging the battery 32 with regenerative electric power from the motor 30. At the time of charging, control for charging the battery 32 with electric power from an external device such as a charging stand 20 is performed. The vehicle 12 includes an outside air temperature sensor 36 that measures an outside air temperature and a battery temperature sensor 38 that measures a temperature of the battery 32.

Figure 3:
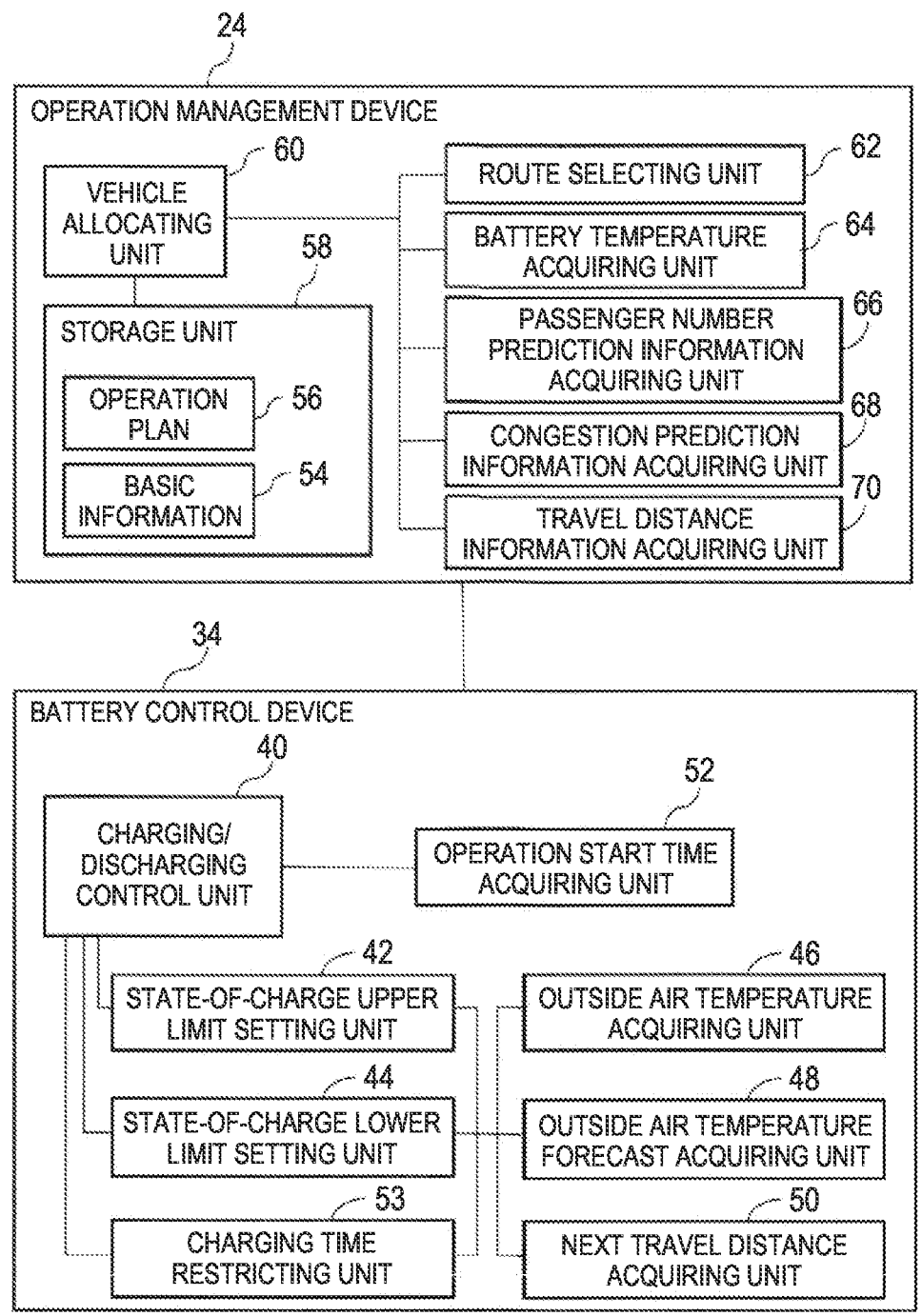
FIG. 3 is a block diagram illustrating functions of an operation management device and a battery control device according to the embodiment.

FIG. 3 is a functional block diagram illustrating the functions of the operation management device 24 and the battery control device 34. The operation management device 24 and the battery control device 34 are configured to realize their predetermined functions by causing a processor to execute predetermined programs.

The battery control device 34 includes a charging/discharging control unit 40 that controls charging/discharging of the battery 32. The charging/discharging control unit 40 controls electric power which is supplied to the motor 30 and electric power which is regenerated from the motor 30. The charging/discharging control unit 40 controls a state of charge of the battery 32 within a management range between a predetermined state-of-charge upper limit and a predetermined state-of-charge lower limit. At the time of charging, the charging/discharging control unit 40 monitors the state of charge of the battery 32 and ends the charging when the state of charge reaches the state-of-charge upper limit. When the state of charge of the battery 32 reaches the state-of-charge lower limit or approaches the state-of-charge lower limit while the vehicle 12 is operating, the charging/discharging control unit 40 may notify a user to encourage charging. In view of durability, the state of charge of the battery 32 is managed within an intermediate range such that the state of charge does not become 100% or 0% and is managed in a range of 40% to 80% in a normal state. In the vehicle 12 or the battery control device 34, the state-of-charge upper limit is changed according to information on the outside air temperature as will be described later. The state-of-charge lower limit in addition to the state-of-charge upper limit may be changed according to the information on the outside air temperature. The battery control device 34 includes a state-of-charge upper limit setting unit 42 and a state-of-charge lower limit setting unit 44 that set the state-of-charge upper limit and the state-of-charge lower limit, respectively.

The battery control device 34 includes an outside air temperature acquiring unit 46. The outside air temperature acquiring unit 46 acquires the outside air temperature near the vehicle at that time based on a signal from the outside air temperature sensor 36 provided in the vehicle 12. An outside air temperature sensor may be provided at one or more positions near the route 14 and the vehicle 12 may acquire information from the outside air temperature sensors directly or via the operation management center 22. The outside air temperature sensor may be provided in the operation management center 22. The outside air temperature acquiring unit 46 may directly receive weather information transmitted from a public institution such as a meteorological agency or a private service provider or acquire the weather information via the operation management center 22 and acquire the air temperature of a region including the route 14 as the outside air temperature. Information from the operation management center 22 is acquired in a wired or wireless manner. When the information is acquired in a wired manner, the information is acquired, for example, by wired connection during charging in the charging station 18.

The battery control device 34 further includes an outside air temperature forecast acquiring unit 48. The outside air temperature forecast acquiring unit 48 acquires weather forecasts transmitted from a public institution such as a meteorological agency or a private service provider and acquires an air temperature within a predetermined time or after a predetermined time or the lowest air temperature of the next morning. The outside air temperature forecast acquiring unit 48 may acquire outside air temperature forecasts via the operation management center 22 in a wired or wireless manner or may directly acquire the outside air temperature forecasts via the Internet or the like.

The battery control device 34 further includes a next travel distance acquiring unit 50. The next travel distance acquiring unit 50 acquires a travel distance in the next operation of the vehicle 12 based on an operation plan. The travel distance in the next operation may be acquired from the operation management center 22 when the vehicle 12 stops in the charging station 18. Alternatively, the travel distance in the next operation may be acquired from the operation management center 22 while the vehicle 12 is operating. The battery control device 34 further includes an operation start time acquiring unit 52. The operation start time acquiring unit 52 acquires a start time of a next operation of the vehicle 12 based on the operation plan. The start time of the next operation may be acquired from the operation management center 22 when the vehicle 12 stops in the charging station 18. The battery control device 34 further includes a charging time restricting unit 53 that restricts the length of time of one charging session of the battery 32.

The operation management device 24 includes a storage unit 58 that stores the routes 14, basic information 54 on the routes such as distances and required times between the bus stops 16, and an operation plan 56 of services. The operation plan 56 includes information such as the route 14 of each service, departure and arrival times at the charging station 18, and a departure time from each bus stop 16 and further includes information of the vehicle 12 allocated to each service. The operation management device 24 includes a vehicle allocating unit 60 that allocates vehicles 12 to the services. The vehicle allocating unit 60 allocates the vehicle 12 to the services based on basic information 54, conditions of the vehicles 12, and external conditions.

The operation management device 24 includes a route selecting unit 62 that selects an operation route corresponding to a certain vehicle 12. For example, the route selecting unit 62 selects an operation route or a service in which a vehicle of which the state of charge is restricted can travel on the restricted state of charge.

The operation management device 24 includes a battery temperature acquiring unit 64 that acquires a temperature of the battery 32 of each vehicle 12. The battery temperature acquiring unit 64 acquires a battery temperature based on a signal from the battery temperature sensor 38 provided in each vehicle 12. The battery temperature may be acquired in a wireless manner or in a wired manner at the time of charging. By ascertaining a vehicle 12 with a low battery temperature and allocating the vehicle 12 to a service with a large load, it is possible to promote a decrease of the state of charge of the battery 32 of the vehicle 12. In order to select a service with a large load, the operation management device 24 includes a passenger number prediction information acquiring unit 66, a congestion prediction information acquiring unit 68, and a travel distance information acquiring unit 70. The passenger number prediction information acquiring unit 66 acquires a predicted number of passengers for a certain service based on past operation results and requests from scheduled users. The congestion prediction information acquiring unit 68 acquires congestion information on a route 14 from the past operation results, a traffic information providing service, or currently operating vehicles. The travel distance information acquiring unit 70 acquires a travel distance for each service based on information stored in the storage unit 58.

In general, a battery tends to have a lower charging efficiency and a longer charging time as its temperature becomes lower. When a charging time of a commercial vehicle such as a regular-route bus increases, an operable time of the vehicle decreases and an operation rate of the vehicle decreases. In order to decrease the charging time, it is necessary to maintain the battery at the time of charging at a high temperature. In the operation system 10, an increase of the charging time is curbed by maintaining the battery temperature at a high temperature using the fact that an amount of heat generated in the battery increases at the time of charging in a state in which the state of charge of the battery is low.

When the outside air temperature is low, the battery control device 34 sets the state-of-charge upper limit to be lower than that at a normal temperature such that charging is performed in a low state of charge. The state-of-charge upper limit setting unit 42 sets the upper limit of the state of charge to, for example, 80% at the normal temperature. When the outside air temperature acquiring unit 46 acquires the outside air temperature which is equal to or lower than a predetermined temperature (for example, 5° C.), the state-of-charge upper limit setting unit 42 sets the state-of-charge upper limit to a low-temperature state-of-charge upper limit (for example, 70%) lower than that at the normal temperature.

Figure 4:
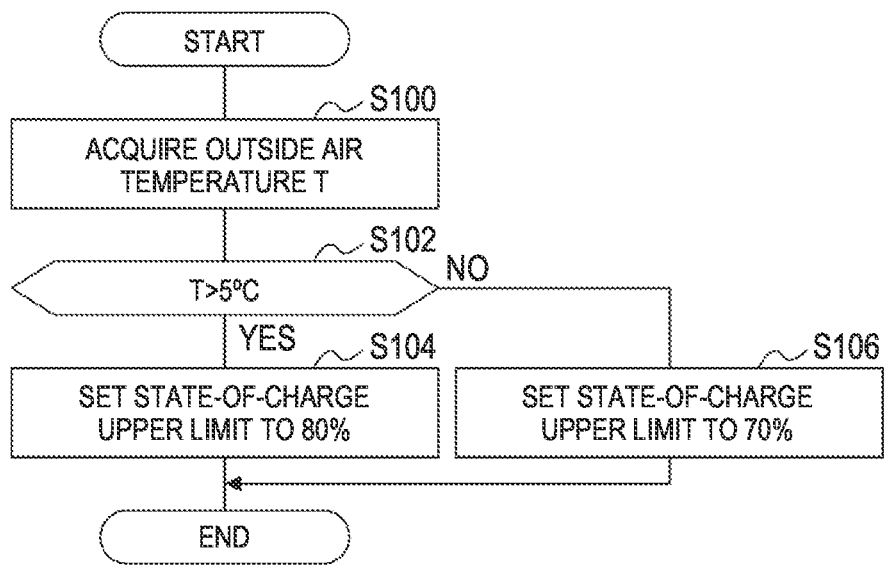
FIG. 4 is a flowchart illustrating an example of a control flow associated with setting of a state-of-charge upper limit according to the embodiment.

FIG. 4 illustrates an example of a flowchart associated with control for changing setting of the state-of-charge upper limit according to an outside air temperature. An outside air temperature T is acquired (S100) and it is determined whether the acquired outside air temperature T is higher than a predetermined temperature (for example, 5° C.) (S102). When the outside air temperature is higher than the predetermined temperature, the state-of-charge upper limit is set to a normal-temperature state-of-charge upper limit (for example, 80%) (S104). On the other hand, when it is determined in Step S102 that the outside air temperature T is equal to or lower than the predetermined temperature, the state-of-charge upper limit is set to a low-temperature state-of-charge upper limit (for example, 70%) (S106).

By decreasing the state-of-charge upper limit, an opportunity for charging in a low state of charge increases. When the upper limit of a state of charge at the normal temperature is set to 80%, the lower limit thereof is set to 40%, and the state of charge decreases by 15% with one time of circulation of the vehicle 12 along the circuit route 14A, the state of charge becomes 35% (=80%−15%×3) which is lower than the lower limit 40% with three times of circulation. Accordingly, when the vehicle 12 travels along the circuit route 14A, the vehicle 12 needs to return to the charging station 18 every two times of circulation. When the state of charge at a departure time point is 80%, the state of charge becomes 50% after two times of circulation. When charging is performed in this state, every charging is performed in a range of the state of charge of 50% to 80%. By setting the state-of-charge upper limit to the low-temperature state-of-charge upper limit 70%, the state of charge at the departure time point is 70% and the state of charge after two times of circulation is 40%. The charging is performed in a range of the state of charge 40% to 50% in which the charging could not be performed in the settings at the normal temperature, that is, in a lower range, the amount of generated heat increases, and thus it is possible to increase the temperature of the battery 32.

The battery control device 34 sets the state-of-charge lower limit to be lower than that at the normal temperature when the outside air temperature is low such that charging is performed in a lower state of charge. The state-of-charge lower limit setting unit 44 sets the state-of-charge lower limit to, for example, 40% at the normal temperature. When the outside air temperature acquiring unit 46 acquires the outside air temperature which is equal to or less than the predetermined air temperature (for example, 5° C.), the state-of-charge lower limit setting unit 44 sets the state-of-charge lower limit to a low-temperature state-of-charge lower limit (for example, 30%) which is lower than that at the normal temperature. A change width of the state-of-charge lower limit may be determined separately from the change width of the state-of-charge upper limit. For example, when the state-of-charge upper limit is changed from 80% to 65%, the state-of-charge lower limit can be changed from 40% to 30%. The change width of the state-of-charge lower limit may be determined to be the same as the change width of the state-of-charge upper limit. For example, when the state-of-charge upper limit is changed from 80% to 65%, the state-of-charge lower limit can be changed from 40% to 25%. By setting the change widths of the state-of-charge upper limit and the state-of-charge lower limit to the same, an effective state of charge does not change and an operation plan which is prepared based on the assumption that the outside air temperature is the normal temperature does not need to be changed in terms of the travel distance. When the upper limit of the state-of-charge at the normal temperature is set to 80%, the lower limit thereof is set to 40%, and the state of charge decreases by 20% with one shuttling of the vehicle 12 along the shuttle route 14B, the state of charge becomes 40% (=80%−20%× 2). That is, the vehicle 12 can shuttle along the shuttle route 14B two times at the normal temperature. At a low temperature, when the state-of-charge upper limit is set to 65% and the state-of-charge lower limit is set to 30%, a state-of-charge management range defined by the state-of-charge upper limit and the state-of-charge lower limit narrows to 35%, the effective state of charge decreases in comparison with that at the normal temperature, and the vehicle 12 cannot shuttle along the shuttle route 14B two times. In this case, the operation plan needs to be reviewed, but the vehicle 12 can shuttle two times and the operation plan does not need to be changed by setting the change widths of the state-of-charge upper limit and the state-of-charge lower limit and maintaining the management range of the state of charge.

Figure 5:
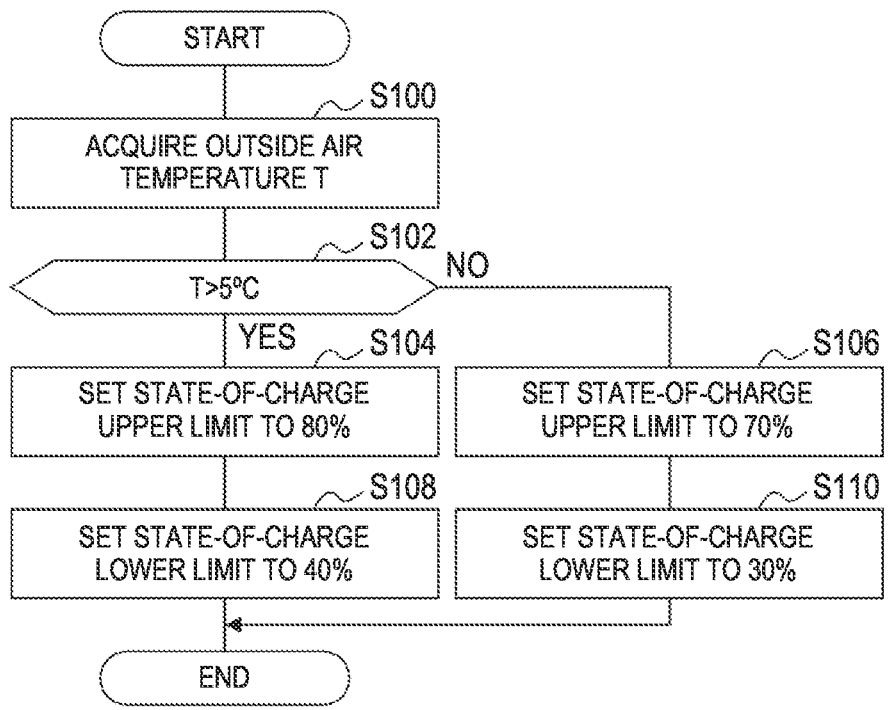
FIG. 5 is a flowchart illustrating an example of a control flow associated with setting of a state-of-charge upper limit and a state-of-charge lower limit according to the embodiment.

FIG. 5 illustrates an example of a flowchart associated with control for changing settings of the state-of-charge lower limit in addition to the state-of-charge upper limit according to the outside air temperature. The same steps as in the flowchart illustrated in FIG. 4 will be referred to by the same reference signs and description thereof will be omitted. When it is determined in Step S102 that the acquired outside air temperature T is higher than the predetermined temperature, the state-of-charge lower limit is set to the normal-temperature state-of-charge lower limit (for example, 40%) (S108). On the other hand, when it is determined in Step S102 that the outside air temperature T is equal to or lower than the predetermined temperature, the state-of-charge lower limit is set to the lower-temperature state-of-charge lower limit (for example, 30%) (S110).

The battery control device 34 may change the low-temperature state-of-charge upper limit according to a travel distance to next charging. The next travel distance acquiring unit 50 acquires a travel distance of a next service to which the vehicle 12 is allocated based on the operation plan. The next travel distance may be acquired from the operation management device 24 when the vehicle 12 returns to the charging station 18, or an operation plan in a predetermined period (for example, one day) may be acquired at a time, a travel distance of each service in the period may be stored, and the next travel distance may be acquired therefrom. A vehicle 12 which is alternately allocated to a service in which a vehicle circulates along the circuit route 14A two times and shuttles along the shuttle route 14B one time in an operation plan will be specifically exemplified below. Similarly to the aforementioned example, it is assumed that the upper limit of the state of charge at the normal temperature is set to 80%, the lower limit thereof is set to 40%, 15% of the state of charge is consumed with one turn along the circuit route 14A, and 20% of the state of charge is consumed with one turn along the shuttle route 14B. When the low-temperature state-of-charge upper limit is set to correspond to the service in which a vehicle circulates along the circuit route 14A requiring a large state of charge two times, the low-temperature state-of-charge upper limit is 70%. The state-of-charge lower limit is not changed. In this case, the state of charge after the vehicle 12 has shuttled along the shuttle route 14B one time is 50% (=70%−20%) and next charging is performed in a range of the state of charge of 50% to 70%. On the other hand, charging in a lower range (for example, equal to or lower than 50%) is possible by changing the state-of-charge upper limit according to the travel distance in the next operation. For example, the low-temperature state-of-charge upper limit at the time of charging before the vehicle travels along the circuit route 14A is set to 70% and the low-temperature state-of-charge upper limit at the time of charging before the vehicle travels along the shuttle route 14B is set to 60%. When charging is performed based on these state-of-charge upper limits, the effective state of charge 30% required for the service in which the vehicle circulates along the circuit route 14A two times is secured and the effective state of charge 20% required for the service in which the vehicle shuttles along the shuttle route 14B one time is secured. After the vehicle has operated in the service in which the vehicle shuttles along the shuttle route 14B one time, the state of charge is 40%, and charging is performed in the range of state of charge 40% to 70% in the next charging. In comparison with a case in which the low-temperature state-of-charge upper limit is not changed, the opportunity for charging in the state-of-charge range of 40% to 50% increases and charging is performed in a lower state of charge.

The battery control device 34 may perform charging such that the charging ends immediately before a next operation start time when the state-of-charge upper limit to the low-temperature state-of-charge upper limit. The operation start time acquiring unit 52 acquires an operation start time of a next service to which the vehicle 12 is allocated based on the operation plan. The next operation start time may be acquired from the operation management device 24 when the vehicle 12 returns to the charging station 18, or an operation plan in a predetermined period (for example, one day) may be acquired at a time, an operation start time of each service in the period may be stored, and the next operation start time may be acquired therefrom. A charging start time is calculated by counting back from the operation start time. The battery temperature and the time required for charging to a set low-temperature state-of-charge upper limit may be stored in correlation in advance, the time required for charging may be acquired based on the correlation, and the charging start time may be calculated. By leaving no time between charging and operation, the battery temperature which has increased at the time of charging is not decreased until the operation is started. Accordingly, it is possible to effectively charge the battery with regenerative electric power at the time of operation.

The battery control device 34 may acquire a forecast of the outside air temperature and set the state-of-charge upper limit to be lower than that at the normal temperature before the outside air temperature decreases. In addition to changing of the state-of-charge upper limit, the state-of-charge lower limit may be set to be lower than that at the normal temperature or the state-of-charge lower limit may be set such that the management range of the state of charge is the same as that at the normal temperature. Even when a current outside air temperature is high, the battery can be heated in advance before the outside air temperature decreases. The outside air temperature forecast acquiring unit 48 acquires an outside air temperature forecast in the night, in the tomorrow morning, after predetermined time, or before a predetermined time. The outside air temperature forecast acquiring unit 48 may acquire a forecast of a lowest air temperature tomorrow. When the outside air temperature in the outside air temperature forecast is lower than a predetermined temperature, the state-of-charge upper limit setting unit 42 sets the state-of-charge upper limit to the low-temperature state-of-charge upper limit based on the acquired outside air temperature forecast before the outside air temperature decreases to the predetermined temperature. The state-of-charge lower limit setting unit 44 may set the state of charge at a low temperature, that is, state-of-charge lower limit, to the low-temperature state-of-charge lower limit along with the state-of-charge upper limit setting unit 42. The time at which the low-temperature state-of-charge upper limit and the low-temperature state-of-charge lower limit are set may be a predetermined time, for example, 5 hours, prior to the time at which the outside air temperature is forecasted to be lower than the predetermined air temperature. The time may be a time determined in advance, for example, 0 o'clock.

The outside air temperature forecast acquiring unit 48 may acquire a forecast of several days such as a weekly weather forecast. When a low temperature is predicted in the period forecast, the state-of-charge upper limit setting unit 42 sets the state-of-charge upper limit to the low-temperature state-of-charge upper limit in the period. The state-of-charge lower limit setting unit 44 may set the state of charge at a low temperature, that is, the state-of-charge lower limit, to the low-temperature state-of-charge lower limit along with the state-of-charge upper limit setting unit 42. Whether the outside air temperature is low in the period may be determined, for example, based on whether days in which the lowest air temperature is lower than a predetermined air temperature reach predetermined days in the period. For example, when the lowest air temperature of three days out of seven days is lower than the predetermined air temperature, the state-of-charge upper limit and the state-of-charge lower limit in such a period may be set to the low-temperature state-of-charge upper limit and the low-temperature state-of-charge low limit, respectively.

The battery control device 34 may restrict one charging period of time when the outside air temperature is lower than a predetermined temperature or when it is supposed in the forecast that the outside air temperature is lower than a predetermined temperature. Accordingly, an opportunity for using the battery 32 in a low state of charge increases and charging is performed in a low state of charge. The charging time restricting unit 53 sets the one charging period of time to a short time based on information which is acquired by the outside air temperature acquiring unit 46 or the outside air temperature forecast acquiring unit 48 and which indicates that the outside air temperature is low or decreases. The battery temperature and the time required to reach the state-of-charge upper limit when charging is performed at the battery temperature may be correlated in advance and the charging period of time may be set to a time shorter than the time. The battery temperature may be acquired from the battery temperature sensor 38.

The operation management device 24 may select a route based on a travel distance corresponding to the low-temperature state-of-charge upper limit for a vehicle 12 of which the state-of-charge upper limit is set to the low-temperature state-of-charge upper limit. When the state-of-charge upper limit is set to the low-temperature state-of-charge upper limit and the effective state of charge decreases, a short operation route is selected as a result. For example, an operation route in which a vehicle circulates along the circuit route 14A one time, an operation route in which a vehicle circulates along the circuit route 14A two times, an operation route in which a vehicle shuttles along the shuttle route 14B one time, an operation route in which a vehicle shuttles along the shuttle route 14B two times, and an operation route in which a vehicle circulates along the circuit route 14A one time and shuttles along the shuttle route 14B one time are set in advance. It is assumed that the state of charge decreases by 15% in the operation route in which a vehicle circulates along the circuit route 14A one time and the state of charge decreases by 20% in the operation route in which a vehicle shuttles along the shuttle route 14B one time. Then, the state of charge decreases by 30% in the operation route in which a vehicle circulates along the circuit route 14A two times, the state of charge decreases by 40% in the operation route in which a vehicle shuttles along the shuttle route 14B two times, and the state of charge decreases by 35% in the operation route in which a vehicle travels along the circuit route 14A and the shuttle route 14B once. At the normal temperature, when the state-of-charge upper limit is 80% and the state-of-charge lower limit is 40%, all the operation routes can be selected. At a low temperature, when the state-of-charge upper limit is low or when the state-of-charge lower limit decreases and the effective state of charge decreases in addition, an operation route in which the vehicle can travel in the state of charge is selected out of the operation routes. For example, when the state-of-charge upper limit is set to 65% and the state-of-charge lower limit does not change, an operation route in which the state of charge decreases by 25% or less, that is, the operation route in which a vehicle circulates along the circuit route 14A one time and the operation route in which a vehicle shuttles along the shuttle route 14B one time, can be selected. When the state-of-charge upper limit is set to 65% and the state-of-charge lower limit is set to 30%, an operation route other than the operation route in which a vehicle shuttles along the shuttle route 14B two times can be selected out of the operation routes. An operation plan is prepared based on the restricted operation routes.

The operation management device 24 may acquire the battery temperatures and allocate a vehicle 12 with a low battery temperature to a service in which a load is supposed to be high. By allocating the vehicle with a low temperature to a service in which a load is supposed to be high, it is possible to further decrease the state of charge of the vehicle 12 and to perform charging of the vehicle in a low state of charge at the time of next charging. A load is high in a service in which the number of passengers is large, a service in which a vehicle travels in a congested section, a service in which the travel distance is long, and the like.

The passenger number prediction information acquiring unit 66 predicts the number of passengers in a service based on an operation result, requests from scheduled users, and the like. The operation result is, for example, the number of passengers every day and every time period in each route 14. The number of passengers in the past operation is collected to prepare a result every day and every time period and the result is stored. The operation result may include information indicating a correlation between an event of a facility close to the route 14 and the number of passengers. In a system in which a vehicle stops at a bus stop 16 in response to a user's request, the number of passengers can be predicted based on the request information. The operation result may be stored, for example, in the storage unit 58 of the operation management device 24. The vehicle allocating unit 60 allocates a vehicle 12 with a low battery temperature to a service in which the number of passengers is predicted to be larger than a predetermined number. When allocation has been determined already, replacing the vehicle 12 or the like is performed.

The congestion prediction information acquiring unit 68 predicts a service in which a vehicle is caught in a traffic jam based on the operation result, information from a vehicle operating currently, and congestion information acquired from a traffic information provider service such as VICS (registered trademark). The operation result is, for example, a required time between the bus stops 16 every day and every time period in each route 14, and congestion can be predicted to occur in a time period based on information indicating that the required time is longer than those in other time periods. The congestion information can be acquired based on information from a vehicle 12 operating currently, for example, a traveling speed. When a low-speed state in which a traveling speed of a vehicle 12 is low is maintained for a long time or when stop and start are frequently repeated, it is determined that congestion has occurred in a section in which the vehicle 12 is traveling. The congestion information may be acquired from the traffic information provider service such as VICS (registered trademark). When a vehicle of a service is traveling in a section in which congestion has occurred, it can be predicted that the service is caught in congestion. The operation result may be stored, for example, in the storage unit 58 of the operation management device 24. The vehicle allocating unit 60 allocates a vehicle 12 with a low battery temperature to a service in which a vehicle is caught in congestion. When allocation has been determined already, replacing the vehicle 12 or the like is performed.

The travel distance information acquiring unit 70 acquires a travel distance of a service based on the operation plan 56 and the basic information 54 stored in the storage unit 58. A vehicle 12 with a low battery temperature is allocated to a service in which the travel distance is long at the time of next operation. The vehicle allocating unit 60 allocates a vehicle 12 with a low battery temperature to a service in which the travel distance is long. When allocation has been determined already, replacing the vehicle 12 or the like is performed.

Figure 6:
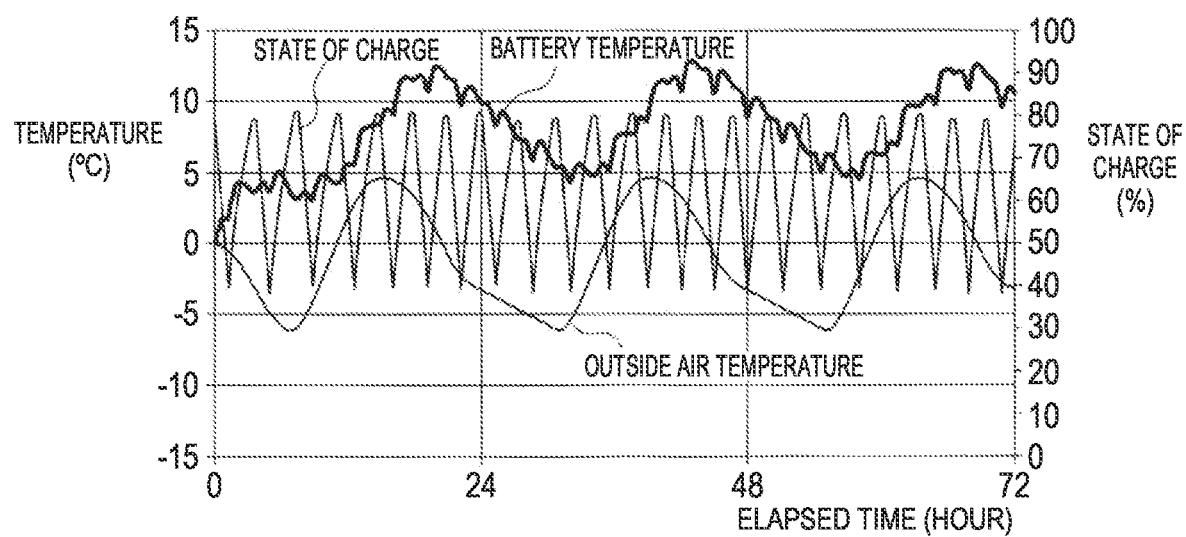
FIG. 6 is a diagram illustrating a result of simulation of changes of a state of charge and a battery temperature when the state-of-charge upper limit and the state-of-charge lower limit are set to values at normal temperatures.
Figure 7:
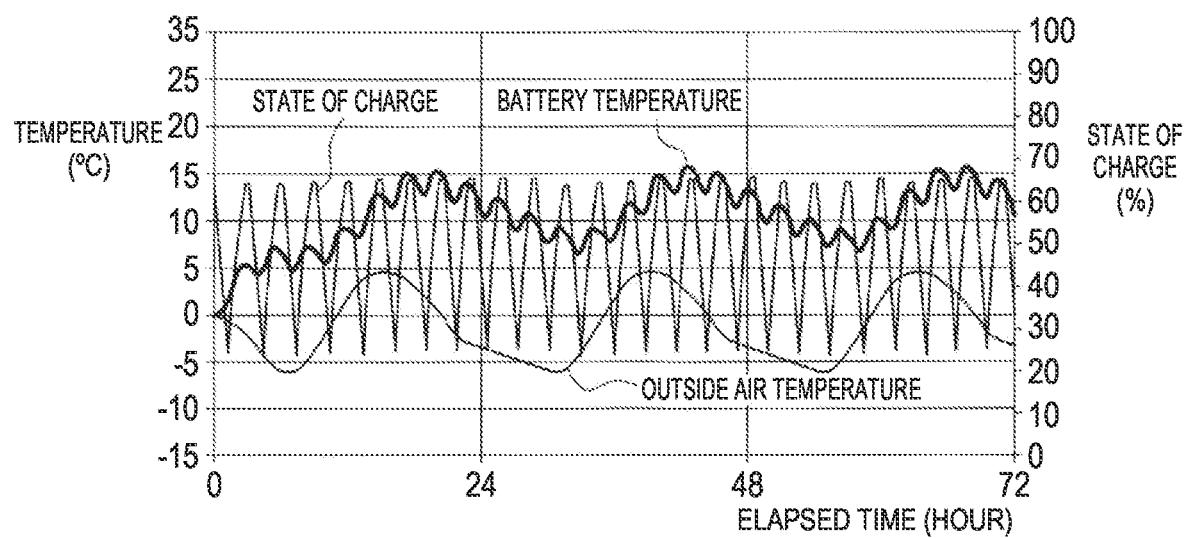
FIG. 7 is a diagram illustrating a result of simulation of changes of a state of charge and a battery temperature when the state-of-charge upper limit and the state-of-charge lower limit are set to values at low temperatures.

FIGS. 6 and 7 are diagrams illustrating simulation results of the state of charge and the battery temperature when the settings of the state-of-charge upper limit and the state-of-charge lower limit are changed. FIG. 6 illustrates changes of the state of charge and the battery temperature when the state-of-charge upper limit is set to 80% and the state-of-charge lower limit is set to 40% and FIG. 7 illustrates changes of the state of charge and the battery temperature when the state-of-charge upper limit is set to 65% and the state-of-charge lower limit is set to 25%. As the outside air temperature in winter, a lowest temperature is −6° C., a highest temperature is 5° C., and daily temperature changes are the same. A vehicle 12 travels for 73.5 minutes, returns to the charging station 18, and performs charging. The charging is performed until the state of charge reaches the state-of-charge upper limit and the vehicle restarts its operation after the charging has been completed. The traveling and the charging are repeated without any break. Since the battery temperature in both the simulation results illustrated in FIGS. 6 and 7 is low at the start time of simulation, comparison and review are not performed on such a time period.

When the management range of the state of charge is set to a range of 40% to 80% (FIG. 6), one charging period of time ranges from 85 minutes to 110 minutes, an average value of the battery temperatures is 8.4° C., and average charging electric power is 10 kW. On the other hand, when the management range of the state of charge is set to a range of 25% to 65% (FIG. 7), one charging period of time ranges from 70 minutes to 85 minutes, an average value of the battery temperatures is 11° C., and average charging electric power is 13 kW. By lowering the management range of the state of charge, it can be seen that the battery temperature increases and the charging period of time decreases. Accordingly, the number of traveling operations per day when the management range of the state of charge ranges from 40% to 80% can be changed from seven to eight by changing the management range to a range of 25% to 65%.

In the aforementioned embodiment, the battery control device 34 is provided in a vehicle 12, but some functions thereof may be performed by a device which is installed on the ground such as the operation management center 22. For example, the outside air temperature acquiring unit 46 may be provided on the ground and the state-of-charge upper limit setting unit 42 may receive a command for changing the state-of-charge upper limit from the outside air temperature acquiring unit 46 and change the setting of the state-of-charge upper limit.

Some functions of the battery control device 34 and the operation management center 22 may be performed by an operator in the vehicle 12 or an operation in the operation management center 22. For example, a monitor that displays the outside air temperature may be provided in the vehicle 12 and the operator may manually change the state-of-charge upper limit when the outside air temperature displayed on the monitor decreases. The operator in the operation management center 22 may remotely change the state-of-charge upper limit.

Figure 8:
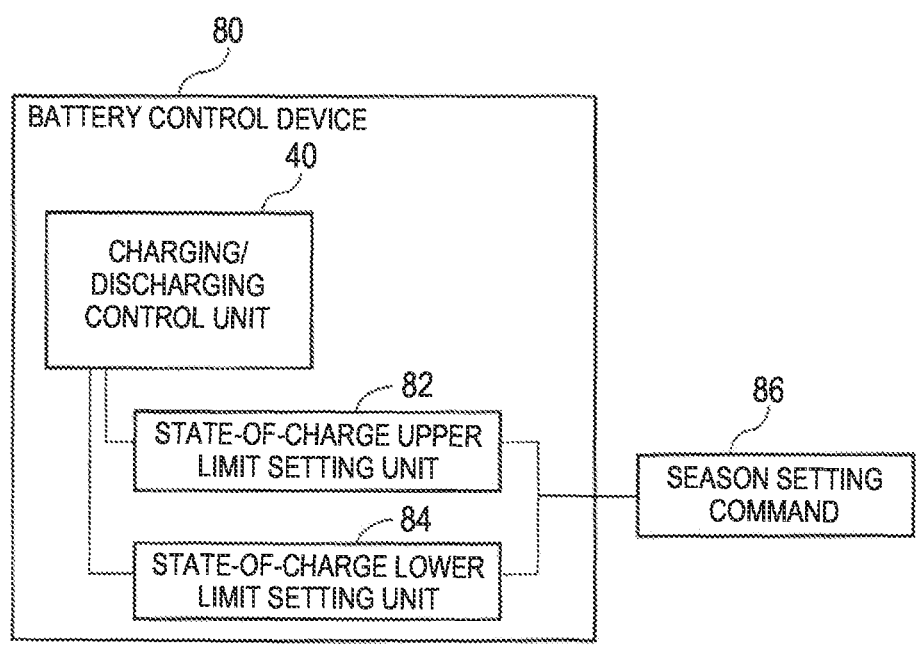
FIG. 8 is a block diagram illustrating functions of a battery control device according to another embodiment.

FIG. 8 is a block diagram illustrating functions of a battery control device 80 according to another embodiment. The whole configuration of the operation system 10, the configuration of a vehicle 12, and the configuration of the operation management device 24 are the same as in the embodiment illustrated in FIGS. 1 and 2. The battery control device 80 includes a charging/discharging control unit 40 that controls charging/discharging of the battery 32. The charging/discharging control unit 40 is the same as described above and thus description thereof will be omitted.

The battery control device 80 sets the management range of the state of charge in a certain season, particularly, in winter, to a range of the state of charge lower than the management range in other seasons and maintains the battery temperature at a high temperature by increasing an opportunity for charging when the state of charge is low. When the battery temperature is high, a charging efficiency is high and an increase in charging period of time due to a low temperature can be curbed. A state-of-charge upper limit setting unit 82 selectively sets a winter state-of-charge upper limit which is used in winter and a summer state-of-charge upper limit which is used in a season other than winter. The winter state-of-charge upper limit has a value lower than the summer state-of-charge upper limit. For example, the summer state-of-charge upper limit can be set to 80% and the winter state-of-charge upper limit can be set to 65%. A state-of-charge lower limit setting unit 84 selectively sets a winter state-of-charge lower limit which is used in winter and a summer state-of-charge lower limit which is used in a season other than winter. The winter state-of-charge lower limit has a value lower than the summer state-of-charge lower limit. For example, the summer state-of-charge lower limit can be set to 40% and the winter state-of-charge lower limit can be set to 25%. The charging/discharging control unit 40 manages the state of charge using the winter state-of-charge upper limit as an upper limit and using the winter state-of-charge lower limit as a lower limit in winter, and manages the state of charge using the summer state-of-charge upper limit as an upper limit and using the summer state-of-charge lower limit as a lower limit in seasons other than winter. The state-of-charge upper limit and the state-of-charge lower limit are set based on a season setting command 86. An yearly schedule in which a winter period is designated is stored, the season setting command 86 for setting the winter state-of-charge upper limit and the winter state-of-charge lower limit is issued when a start date of the winter has come, and the season setting command 86 for setting the summer state-of-charge upper limit and the summer state-of-charge lower limit is issued when an end date of the winter has been passed. The winter can be determined, for example, a season from the first day of December to the last day of February. In this case, the winter state-of-charge upper limit and the winter state-of-charge lower limit are set on the first day of December and the summer state-of-charge upper limit and the summer state-of-charge lower limit are set on the first day of March. The yearly schedule may be stored, for example, in the storage unit 58 of the operation management device 24, and the operation management device 24 may issue the season setting command to vehicles 12 based on the yearly schedule. The yearly schedule may be stored in each vehicle 12. An operator in the operation management center 22, an operator in a vehicle 12, a mechanic of a vehicle 12, or the like may manually perform a season setting operation. Based on this operation, a command is issued, and the winter state-of-charge upper limit and the winter state-of-charge lower limit or the summer state-of-charge upper limit and the summer state-of-charge lower limit are set.

Only the state-of-charge upper limit may be changed depending on seasons. The change width of the state-of-charge upper limit and the change width of the state-of-charge lower limit may be set to the same such that width of the management range does not change, or the change widths may be set to be different such that the width of the management range changes.

In the operation system 10, the charging station 18 is provided at only one place, but may be provided at a plurality of places. For example, the charging station 18 may be additionally provided at end points of the shuttle route 14B.

In the aforementioned embodiment, each of the state-of-charge upper limit and the state-of-charge lower limit is set to two stages for a normal temperature and a low temperature and is changed in two stages, but may be set to three stages. In this case, the outside air temperature used to change the state-of-charge upper limit and the state-of-charge lower limit is set to two or more temperatures depending on the number of stages.

When a period of time in which a certain vehicle does not operate increases, for example, the state-of-charge upper limit of a vehicle which does not operate in a period of time from the midnight to the early morning in which the number of users is small may be set to the upper limit at the normal temperature or the vehicle may be set to be fully charged (100%) in the period even at a low temperature.

In the aforementioned embodiment, regular-route buses for which a route is fixed have been exemplified, but taxis or hired cars of which a travel route is not fixed can also be charged in a low state of charge to shorten the charging period of time by setting the state-of-charge upper limit or the state-of-charge lower limit in addition to the state-of-charge upper limit according to the present disclosure.

What is claimed is:

1. A battery control device mounted on a motor-driven commercial vehicle, the motor-driven commercial vehicle including a battery for power, the battery control device comprising a first processor configured to:
   acquire an outside air temperature value from an outside air temperature sensor configured to measure temperature outside the motor-driven commercial vehicle;
   determine whether the outside air temperature value is higher than a predetermined temperature value;
   set an upper limit value of a state-of-charge (SOC) of the battery to a first upper target value and a lower limit value of the SOC of the battery to a first lower target value in response to a determination that the outside air temperature value is higher than the predetermined temperature value;
   set the upper limit value to a second upper target value and the lower limit value to a second lower target value in response to a determination that the outside air temperature value is equal to or lower than the predetermined temperature value, wherein the second upper target value is lower than the first upper target value and the second lower target value is lower than the first lower target value; and
   control charging of the battery such that the SOC of the battery is in a range between the first lower target value and the first upper target value or in a range between the second lower target value and the second upper target value.

2. The battery control device according to claim 1, wherein the first processor is further configured to
   set the second lower target value such that a difference between the second lower target value and the second upper target value is equal to a difference between the first lower target value and the first upper target value.

3. The battery control device according to claim 1, wherein the first processor is further configured to
acquire a travel distance before the battery of the motor-driven commercial vehicle needs to be recharged, and
change the second upper target value based on the acquired travel distance.

4. The battery control device according to claim 1, wherein the first processor is further configured to
acquire a next operation start time of the motor-driven commercial vehicle, and
control charging of the battery such that charging ends immediately before the next operation start time when the upper limit value is set to the second upper target value.

5. An operation management system that manages an operation of a motor-driven commercial vehicle, the operation management system comprising
the battery control device according to claim 1, and
a second processor configured to select an operation route of the motor-driven commercial vehicle when the upper limit value is set to the second upper target value based on a travel distance corresponding to the second upper target value.

6. An operation management system that manages operations of a plurality of motor-driven commercial vehicles, the operation management system comprising
the battery control device according to claim 1, and
a third processor configured to:
acquire a battery temperature value from a battery temperature sensor mounted on the battery of each of the plurality of motor-driven commercial vehicles;
acquire prediction information of the number of passengers for each service; and
allocate a motor-driven commercial vehicle in which the acquired battery temperature value is the lowest out of the plurality of motor-driven commercial vehicles to a service in which a value of the number of passengers included in the acquired prediction information is greater than a predetermined value.

7. An operation management system that manages operations of a plurality of motor-driven commercial vehicles, the operation management system comprising
the battery control device according to claim 1, and
a fourth processor configured to:
acquire a battery temperature value from a battery temperature sensor mounted on the battery of each of the plurality of motor-driven commercial vehicles;
acquire traffic congestion prediction information for each service; and
allocate a motor-driven commercial vehicle out of the plurality of motor-driven commercial vehicles to a selected service, wherein
the acquired battery temperature value of the allocated motor-driven commercial vehicle is the lowest, and
the acquired traffic congestion prediction information for the selected service indicates there is traffic congestion.

8. An operation management system that manages operations of a plurality of motor-driven commercial vehicles, the operation management system comprising
the battery control device according to claim 1, and
a fifth processor configured to:
acquire a battery temperature value from a battery temperature sensor mounted on the battery of each of the plurality of motor-driven commercial vehicles;
acquire a travel distance value for each service; and
allocate a motor-driven commercial vehicle out of the plurality of motor-driven commercial vehicles to a selected service, wherein
the acquired battery temperature value of the allocated motor-driven commercial vehicle is the lowest, and
the acquired travel distance value of the selected service is greater than a predetermined value.

9. The battery control device according to claim 1, wherein the first processor is configured to set the upper limit value and the lower limit value to increase a possibility of the battery being charged at a lower state-of-charge when the outside air temperature value is equal to or lower than the predetermined temperature value than when the outside air temperature value is higher than the predetermined temperature value.

10. The battery control device according to claim 1, wherein the first processor is configured to acquire the outside air temperature value from the outside air temperature sensor provided near a travel route of the motor-driven commercial vehicle.

11. The battery control device according to claim 1, wherein the predetermined temperature value is 5° C.

* * * * *